(12) United States Patent
Guo et al.

(10) Patent No.: US 8,611,091 B2
(45) Date of Patent: Dec. 17, 2013

(54) THERMAL MODULE FOR SOLAR INVERTER

(75) Inventors: Nighter Guo, New Taipei (TW); Wess Juan, New Taipei (TW); Jinjin He, New Taipei (TW)

(73) Assignee: Asia Vital Components Co., Ltd., New Taipei (TW)

(*) Notice: Subject to any disclaimer, the term of this patent is extended or adjusted under 35 U.S.C. 154(b) by 278 days.

(21) Appl. No.: 13/045,823

(22) Filed: Mar. 11, 2011

(65) Prior Publication Data

US 2012/0229984 A1 Sep. 13, 2012

(51) Int. Cl.
*H05K 7/20* (2006.01)

(52) U.S. Cl.
USPC ............ 361/708; 361/709; 361/710; 361/715; 174/520; 312/223.2; 257/706; 257/720

(58) Field of Classification Search
USPC .......... 361/676–678, 679.46–679.47, 679.54, 361/688–690, 701–722, 752, 760, 762, 767, 361/831
See application file for complete search history.

(56) References Cited

U.S. PATENT DOCUMENTS

| 6,144,556 | A  | * | 11/2000 | Lanclos | 361/695 |
| 6,201,700 | B1 | * | 3/2001  | Tzinares et al. | 361/719 |
| 6,411,514 | B1 | * | 6/2002  | Hussaini | 361/704 |
| 6,845,012 | B2 | * | 1/2005  | Ohkouchi | 361/704 |
| 7,136,286 | B2 | * | 11/2006 | Chuang | 361/703 |
| 7,817,419 | B2 | * | 10/2010 | Illerhaus | 361/692 |
| 8,081,465 | B2 | * | 12/2011 | Nishiura | 361/703 |
| 2005/0078448 | A1 | * | 4/2005 | Kunz | 361/690 |
| 2005/0162875 | A1 | * | 7/2005 | Rodriguez et al. | 363/68 |
| 2007/0076355 | A1 | * | 4/2007 | Oohama | 361/676 |
| 2011/0063801 | A1 | * | 3/2011 | Lin et al. | 361/705 |

* cited by examiner

*Primary Examiner* — Courtney Smith

(57) ABSTRACT

A thermal module for mounting to and using with a solar inverter includes a heat sink, at least one cooling module, and a thermal insulator. The heat sink has a heat-receiving portion and a heat-radiating portion, and the cooling module has a hot side and a cold side. The hot side of the cooling module is in contact with the heat-receiving portion of the heat sink while the cold side is in contact with a heat-producing source on the solar inverter. The thermal insulator is provided in a space between the heat-receiving portion of the heat sink, the cooling module, and the heat-producing source of the solar inverter. With the cooling module provided between the heat sink and the solar inverter, the solar inverter can have largely upgraded heat dissipation efficiency.

5 Claims, 4 Drawing Sheets

THERMAL MODULE FOR SOLAR INVERTER

FIELD OF THE INVENTION

The present invention relates to a thermal module, and more particularly to a thermal module that includes at least one cooling module to enable upgraded heat dissipation performance of a solar inverter.

BACKGROUND OF THE INVENTION

Solar energy is one of the cleanest energy sources currently available in the world. By utilizing the nature-provided solar energy to generate electric power, no environmental pollution will be caused and it is able to avoid the highly dangerous risk in using nuclear power generation. Moreover, the solar cell panel has long service life and requires only low maintenance cost. All these advantageous facts make the solar energy the most preferred green energy for replacing the fossil fuel. Now, in view of environmental protection, solar energy technologies have been more widely applied in various fields.

Solar power generation devices are one of many popular devices that utilize solar energy. As can be found from the currently available solar power generation devices, they are configured mainly for power generation and power storage. Most improvements made to the current solar power generation devices are only changes in the appearance thereof for adding some additional functions thereto. Few people propose solutions as to the circuits and heat dissipation of the solar power generation devices. Following the constantly increased power generation capacity and power storage capacity, electronic elements in the solar inverter for the solar power generation devices would produce heat during electric energy conversion and storage. The produced heat must be timely dissipated to avoid adverse influence on the performance and service life of the solar inverter. Therefore, heat sink is mounted to and used with the solar inverter, so that the heat produced by the solar inverter is radiated from the heat sink to thereby remove the heat from the solar inverter. However, the heat sink can only provide very limited heat dissipation effect and accordingly, the solar inverter can only be cooled to a certain temperature and the housing of the solar inverter could not have constantly lowered temperature. In brief, the solar inverter with the conventional heat sink disadvantageously has limited heat dissipation performance.

SUMMARY OF THE INVENTION

A primary object of the present invention is to provide a thermal module that is able to largely upgrade the heat dissipation performance of a solar inverter.

To achieve the above and other objects, the thermal module according to the present invention is designed for mounting to and using with a solar inverter and includes a heat sink, at least one cooling module, and a thermal insulator. The heat sink has a heat-receiving portion and a heat-radiating portion located opposite to the heat-receiving portion, and the cooling module has a hot side and a cold side. The hot side of the cooling module is in contact with the heat-receiving portion of the heat sink while the cold side is in contact with a heat-producing source on the solar inverter. The thermal insulator is provided between the heat-receiving portion of the heat sink, the cooling module, and the solar inverter.

By providing the cooling module between the heat sink and the solar inverter, and providing the thermal insulator between the heat-receiving portion of the heat sink, the cooling module and the solar inverter, the solar inverter can have largely upgraded heat dissipation performance.

Briefly speaking, the thermal module of the present invention provides the advantages of (1) enabling upgraded heat dissipation performance; and (2) extending the service life of the solar inverter.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
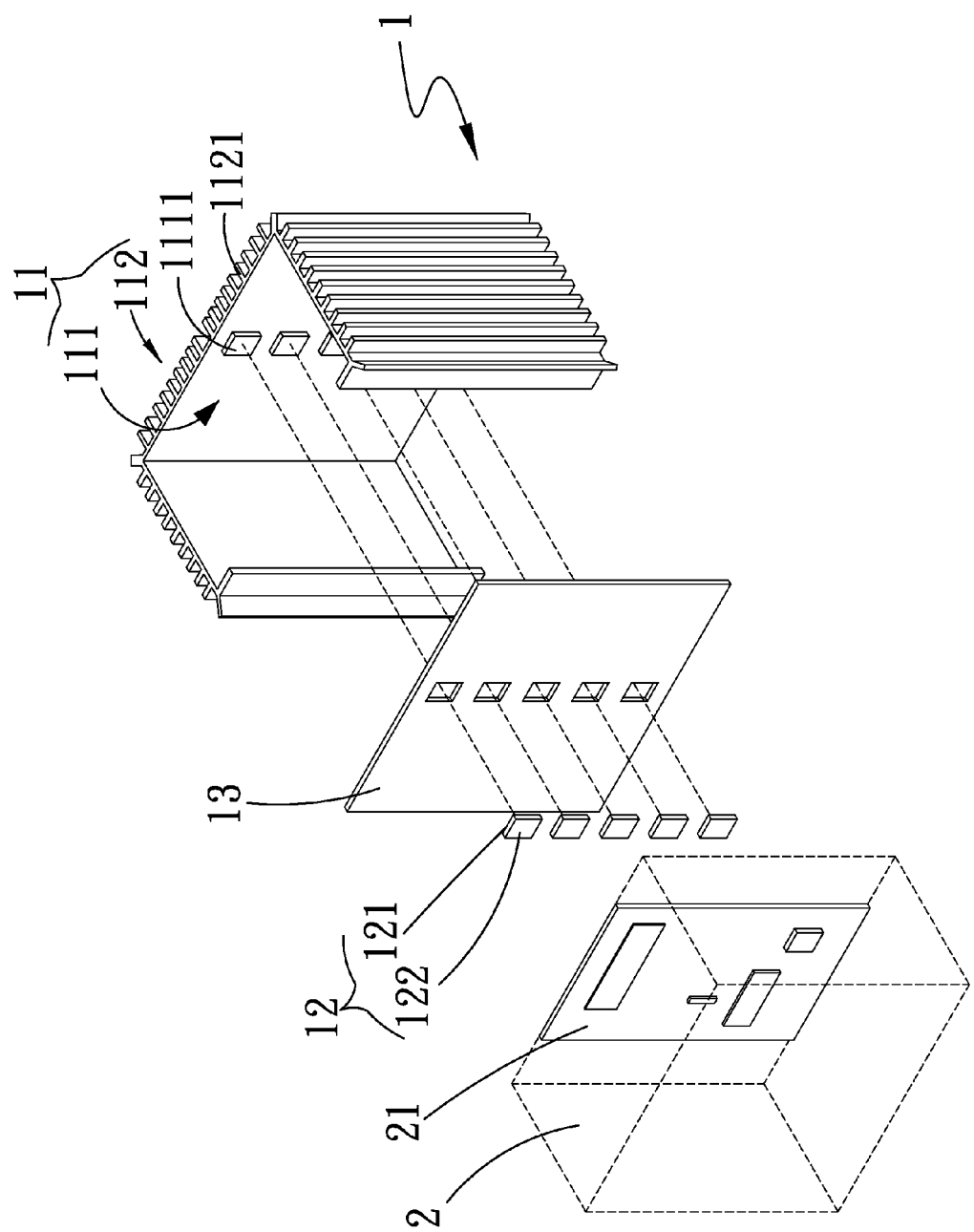
FIG. 1 is an exploded perspective view of a thermal module according to a first embodiment of the present invention.

The present invention will now be described with some preferred embodiments thereof. For the purpose of easy to understand, elements that are the same in the preferred embodiments are denoted by the same reference numerals.

Figure 2:
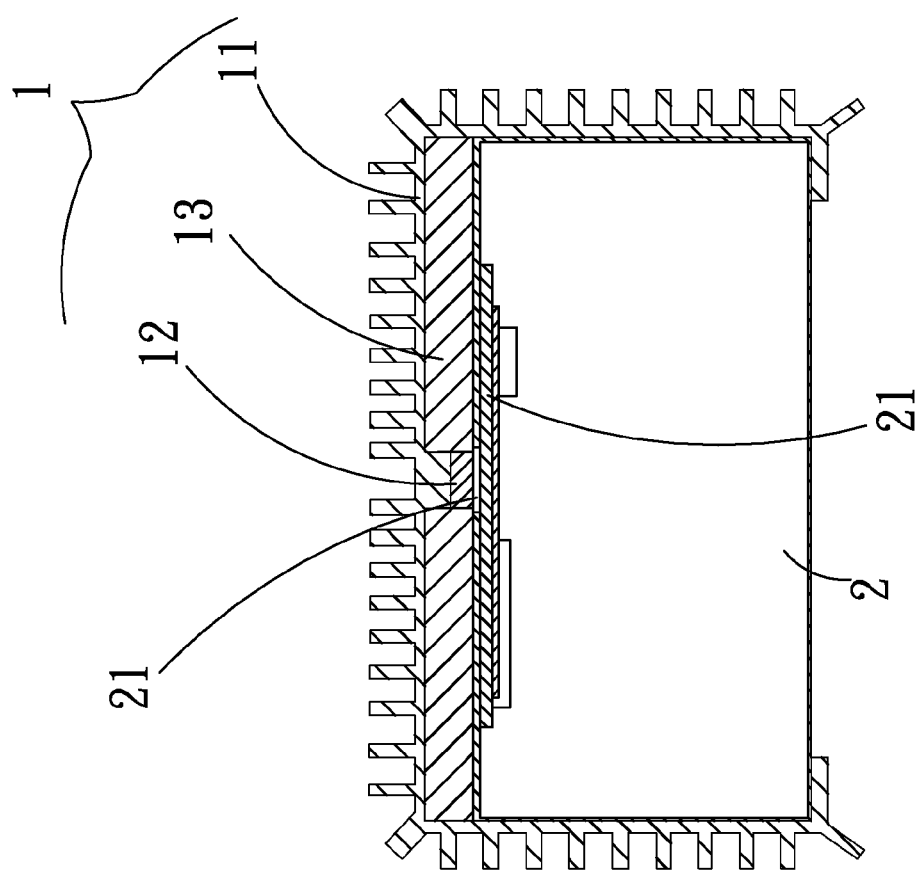
FIG. 2 is an assembled sectional view of the thermal module according to the first embodiment of the present invention.

Please refer to FIGS. 1 and 2 that are exploded perspective and assembled sectional views, respectively, of a thermal module 1 according to a first embodiment of the present invention. The thermal module 1 is designed for mounting to and using with a solar inverter 2, which has at least one heat-producing source 21. The thermal module 1 in the first embodiment includes a heat sink 11, at least one cooling module 12, and a thermal insulator 13.

The heat sink 11 has a heat-receiving portion 111 located at one side thereof and a heat-radiating portion 112 located at another side opposite to the heat-receiving portion 111. The heat-radiating portion 112 includes a plurality of radiating fins 1121. And, the heat sink 11 in the first embodiment is a die-casting aluminum heat sink.

The cooling module 12 has a hot side 121 and a cold side 122. The hot side 121 of the cooling module 12 is in contact with the heat-receiving portion 111 of the heat sink 11 while the cold side 122 is in contact with the solar inverter 2.

The heat-receiving portion 111 of the heat sink 11 further includes at least one raised area 1111, with which the hot side 121 of the cooling module 12 contacts.

The thermal insulator 13 is filled between the heat-receiving portion 111 of the heat sink 11, the cooling module 12, and the solar inverter 2. And, the thermal insulator 13 is thermal-insulating sponge.

Figure 3:
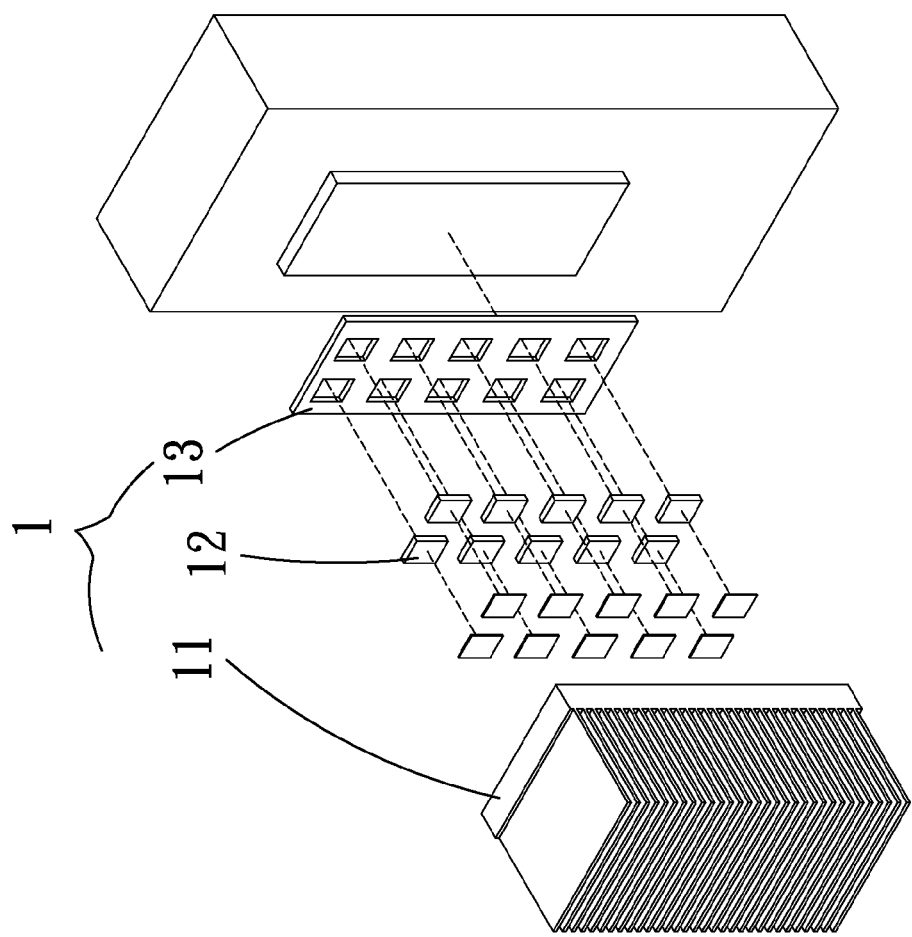
FIG. 3 is an exploded perspective view of a thermal module according to a second embodiment of the present invention.

Please refer to FIG. 3 that is an exploded perspective view of a thermal module 1 according to a second embodiment of the present invention. The thermal module 1 in the second embodiment includes a heat sink 11, at least one cooling module 12, and a thermal insulator 13. Since the thermal module 1 in the second embodiment is generally structurally similar to the first embodiment, it is not discussed in details herein. However, the second embodiment is different from the first embodiment in that the heat sink 11 in the second embodiment is an extruded aluminum heat sink.

Figure 4:
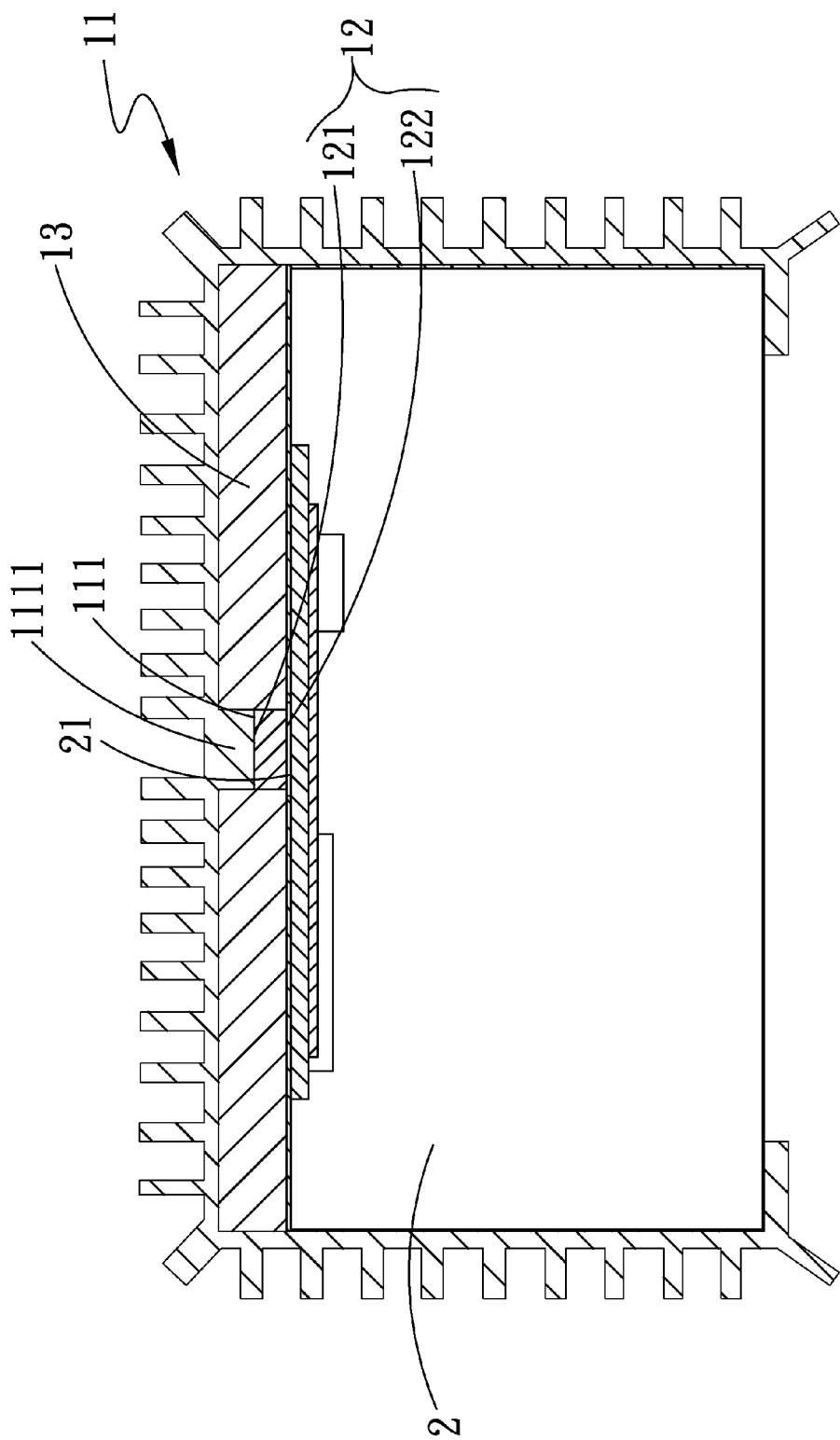
FIG. 4 is a sectional view showing the thermal module of the present invention in use.

FIG. 4 is a sectional view showing the thermal module of the present invention in use. As shown, the thermal module 1 is mounted to and used with a solar inverter 2 that has at least one heat-producing source 21. The cooling module 12 is located between the heat-receiving portion 111 of the heat sink and the heat-producing source 21, such that the hot side 121 of the cooling module 12 contacts with a corresponding raised area 1111 on the heat-receiving portion 111 while the cold side 122 of the cooling module 12 is in contact with the heat-producing source 21. When the solar inverter 2 operates and brings the heat-producing source 21 to produce heat, the cold side 122 of the cooling module 12 in contact with the heat-producing source 21 functions to lower the temperature of the heat-producing source 21. On the other hand, heat absorbed by the cold side 122 is transferred to the hot side 121 of the cooling module 12 before being further transferred to the heat sink 11 via the raised area 1111 on the heat-receiving portion 111 of the heat sink 11. The heat is then transferred to the heat-radiating portion 112 of the heat sink 11 and finally dissipated into ambient air from the radiating fins 1121 on the heat-radiating portion 112. In the present invention, the thermal insulator 13 serves to prevent the heat from transferring from the heat sink 11 back to the solar inverter 2.

What is claimed is:

1. A thermal module for mounting to and using with a solar inverter, comprising:

a heat sink having a heat-receiving portion located at one side thereof and a heat-radiating portion located at another side opposite to the heat-receiving portion;

at least one cooling module having a hot side and a cold side; the hot side being in contact with the heat-receiving portion of the heat sink, and the cold side being in contact with the solar inverter; and a thermal insulator being provided between the heat-receiving portion of the heat sink, the cooling module, and the solar inverter, wherein the heat-receiving portion of the heat sink is provided with at least one raised area, with which the hot side of the at least one cooling module contacts; and wherein the thermal insulator is thermal insulating sponge.

2. The thermal module as claimed in claim 1, wherein the heat-radiating portion of the heat sink includes a plurality of radiating fins.

3. The thermal module as claimed in claim 1, wherein the heat sink is an extruded aluminum heat sink.

4. The thermal module as claimed in claim 1, wherein the heat sink is a die-casting aluminum heat sink.

5. The thermal module as claimed in claim 1, wherein the solar inverter has at least one heat-producing source.

\* \* \* \* \*